(12) United States Patent
Choi

(10) Patent No.: US 8,054,281 B2
(45) Date of Patent: Nov. 8, 2011

(54) LEVEL SHIFTER AND FLAT PANEL DISPLAY USING THE SAME

(75) Inventor: Byong-Deok Choi, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 753 days.

(21) Appl. No.: 12/137,421

(22) Filed: Jun. 11, 2008

(65) Prior Publication Data

US 2009/0027100 A1    Jan. 29, 2009

(30) Foreign Application Priority Data

Jul. 27, 2007    (KR) .................. 10-2007-0075557

(51) Int. Cl.
    *G09G 3/36*    (2006.01)
(52) U.S. Cl. ............. 345/100; 326/63; 326/80; 327/333
(58) Field of Classification Search .................. 327/333; 326/68, 80, 63, 81; 365/200; 325/81
    See application file for complete search history.

(56) References Cited

U.S. PATENT DOCUMENTS

| | | | | |
|---|---|---|---|---|
| 6,049,228 | A * | 4/2000 | Moon | 326/81 |
| 7,071,735 | B2 * | 7/2006 | Shin | 326/81 |
| 2005/0024088 | A1 * | 2/2005 | Lee | 326/81 |
| 2005/0078076 | A1 * | 4/2005 | Kim et al. | 345/98 |
| 2005/0242837 | A1 | 11/2005 | Shin | |

FOREIGN PATENT DOCUMENTS

| | | |
|---|---|---|
| KR | 10-2005-0079803 | 8/2005 |
| KR | 10-2005-0104602 | 11/2005 |
| KR | 10-2006-0000317 | 1/2006 |
| KR | 10-2006-0004237 | 1/2006 |
| KR | 10-2006-0031448 | 4/2006 |

OTHER PUBLICATIONS

Jerry C. Whitaker, Microelectronics 2nd Edition, CRC Press 2006, 2nd Edition, Chapter 6—p. 11.*
Korean Patent Abstracts, Publication 1020050079803 A, Published Aug. 11, 2005, for Kim.
Korean Patent Abstracts, Publication 1020060000317 A, Published Jan. 6, 2006, for Chung.

* cited by examiner

*Primary Examiner* — Seokyun Moon
*Assistant Examiner* — Jose Soto Lopez
(74) *Attorney, Agent, or Firm* — Christie, Parker & Hale, LLP

(57) ABSTRACT

A level shifter for a flat panel display device includes: first and second transistors that are different type transistors and serially coupled between first and second power supplies, the second power supply for supplying a lower voltage power than the first power supply; a first capacitor between gate electrodes of the first and second transistors; an input line for a first input signal coupled to the gate electrode of the first or second transistor; a third transistor between a second electrode of the first capacitor and a third power supply, the third transistor having a gate electrode coupled to an input line of a second input signal; and a fourth transistor between the second electrode of the first capacitor and the third transistor, the fourth transistor having first and gate electrodes that are coupled to the second electrode of the first capacitor, such that the fourth transistor is diode-connected.

20 Claims, 13 Drawing Sheets

LEVEL SHIFTER AND FLAT PANEL DISPLAY USING THE SAME

CROSS-REFERENCE TO RELATED APPLICATION

This application claims priority to and the benefit of Korean Patent Application No. 10-2007-0075557, filed on Jul. 27, 2007, in the Korean Intellectual Property Office, the entire content of which is incorporated herein by reference.

BACKGROUND

1. Field of the Invention

The present invention relates to a level shifter and a flat panel display using the same.

2. Description of the Related Art

Recently, various flat panel display devices that have reduced weight and volume in comparison to a cathode ray tube have been developed. Different types of flat panel display devices include a liquid crystal display, a field emission display, a plasma display panel and an organic light emitting display, etc.

The liquid crystal display displays images by controlling the amount of light generated from the external backlight that is transmitted through the liquid crystal panel. The liquid crystal display can display a large area image at a high resolution as technology has developed. Therefore, it has been used in various fields. Also, the organic light emitting display displays images by using organic light emitting diodes (OLEDs) that generate light through the recombination of electrons and holes. The organic light emitting display has been spotlighted as the next generation display since the organic light emitting display has advantages of rapid response speed and low power consumption.

The liquid crystal display and the organic light emitting display include pixels positioned at crossing portions ("crossings") of scan lines and data lines, a data driver for driving the data lines, and a scan driver for driving the scan lines.

The scan driver sequentially selects the pixels in a horizontal line unit (i.e., a horizontal row of pixels) by sequentially supplying scan signals to the scan lines. The data driver supplies data signals to the data lines in synchronization with the scan signals supplied from the scan lines. As a result, the data signals are supplied to the pixels selected by the scan signals and an image having brightness corresponding to the supplied data signals is then displayed.

The scan driver and/or the data driver include a level shifter unit having a plurality of level shifters that generally shift the magnitude of input signal voltages.

SUMMARY OF THE INVENTION

It is an aspect of an exemplary embodiment according to the present invention to provide a level shifter capable of reducing power consumption and the delay of output signals. Such level shifter, for example, can be used in a flat panel display device.

A level shifter according to an exemplary embodiment of the present invention includes: first and second transistors serially coupled between a first power supply for supplying a first power and a second power supply for supplying a second power having a lower voltage level than that of the first power, the first and second transistors being different type transistors from each other; a first capacitor coupled between a gate electrode of the first transistor and a gate electrode of the second transistor; an input line for a first input signal coupled to the gate electrode of the first transistor or the gate electrode of the second transistor, and coupled to a first electrode of the first capacitor; a third transistor between a second electrode of the first capacitor and a third power supply, the third transistor having a gate electrode coupled to an input line for a second input signal; and a fourth transistor between the second electrode of the first capacitor and the third transistor, the fourth transistor having a gate electrode and a first electrode that are coupled to each other and the second electrode of the first capacitor, such that the fourth transistor is diode-connected.

The first input signal and the second input signal may have opposite waveforms to each other and a transition time of the second input signal may be delayed relative to the first input signal. The second input signal may be generated by inverting the first input signal. The first transistor may be coupled to the input line of the first input signal and the first electrode of the first capacitor, and the second transistor may be coupled to the second electrode of the first capacitor. The third and fourth transistors may be same type transistors as the second transistor. The first transistor may be a P-type transistor and the second to fourth transistors may be N-type transistors. The first transistor may be an N-type transistor and the second to fourth transistors may be P-type transistors. A voltage level of a third power supplied by the third power supply may be between a voltage level of the first power and a voltage level of the second power.

In another exemplary embodiment according to the present invention, a flat panel display includes a level shifter unit including a plurality of level shifters. The flat panel display includes: a scan driver for sequentially supplying scan signals to scan lines; a data driver for supplying data signals to data lines in synchronization with the scan signals; and a display region including a plurality of pixels at crossing portions between the scan lines and the data lines, and for displaying an image corresponding to the data signals. At least one of the scan driver or the data driver includes at least one of the plurality of level shifters. At least one of the level shifters includes: first and second transistors serially coupled between a first power supply for supplying a first power and a second power supply for supplying a second power having a lower voltage level than that of the first power, the first and second transistors being different type transistors from each other; a first capacitor coupled between a gate electrode of the first transistor and a gate electrode of the second transistor; an input line for a first input signal coupled to the gate electrode of the first transistor or the gate electrode of the second transistor, and coupled to a first electrode of the first capacitor; a third transistor between a second electrode of the first capacitor and a third power supply, the third transistor having a gate electrode coupled to an input line for a second input signal; and a fourth transistor between the second electrode of the first capacitor and the third transistor, a the fourth transistor having a gate electrode and a first electrode that are coupled to each other and the second electrode of the first capacitor, such that the fourth transistor is diode-connected.

The scan driver may include a shift register unit for sequentially generating the scan signals corresponding to externally supplied scan driving control signals and the level shifter unit configured to expand a voltage range of the scan signals generated by the shift register unit. The scan driver may further include a buffer unit for supplying the scan signals supplied from the level shifter unit to the scan lines. The data driver may include a shift register unit for sequentially generating sampling signals; a sampling latch unit for sequentially storing data in response to the sampling signals; a holding latch unit for storing the data stored in the sampling latch unit and concurrently outputting the stored data; the level shifter unit configured to expand a voltage range of the data supplied from the holding latch unit; and a data signal generator for generating the data signals corresponding to the data supplied from the level shifter unit. The data driver may further include a buffer unit for supplying the data signals to the data lines. The first input signal and the second input signal may have opposite waveforms to each other and a transition time of the second input signal may be delayed relative to the first input signal. The second input signal may be generated by inverting the first input signal. The first transistor may be coupled to the input line of the first input signal and the first electrode of the first capacitor, and the second transistor may be coupled to the second electrode of the first capacitor. The third and fourth transistors may be same type transistors as the second transistor. The first transistor may be a P-type transistor and the second to fourth transistors may be N-type transistors. The first transistor may be an N-type transistor and the second to fourth transistors may be P-type transistors. A voltage level of a third power supplied by the third power supply may be between a voltage level of the first power and the voltage level of the second power.

BRIEF DESCRIPTION OF THE DRAWINGS

These and/or other embodiments and features of the invention will become apparent and more readily appreciated from the following description of certain exemplary embodiments, taken in conjunction with the accompanying drawings of which.

DETAILED DESCRIPTION OF EXEMPLARY EMBODIMENTS

Figure 1:
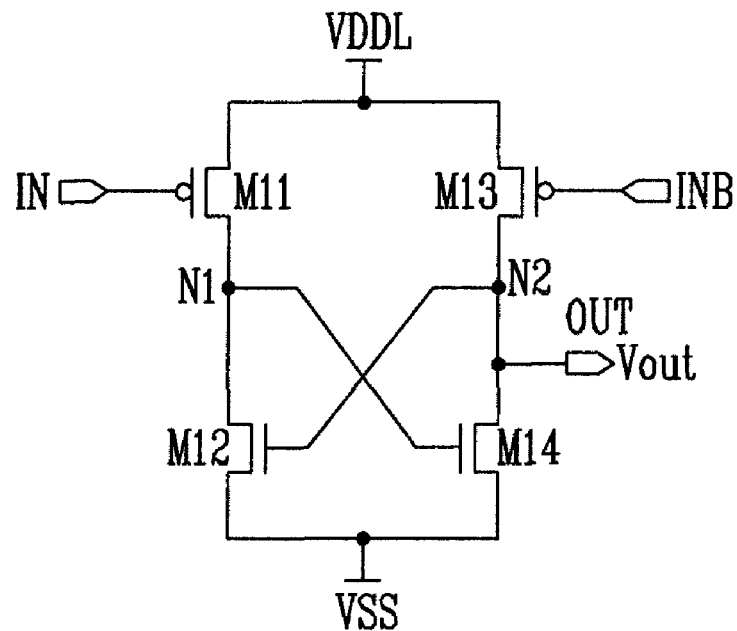
FIG. 1 is a circuit diagram showing a conventional level shifter.

Hereinafter, certain exemplary embodiments according to the present invention will be described with reference to the accompanying drawings. Here, when a first element is described as being coupled to a second element, the first element may be directly coupled to the second element, or may alternately be indirectly coupled to the second element via a third element. Further, some of the elements that are not essential to the complete understanding of the invention are omitted for clarity. Also, like reference numerals refer to like elements throughout.

Figure 2:
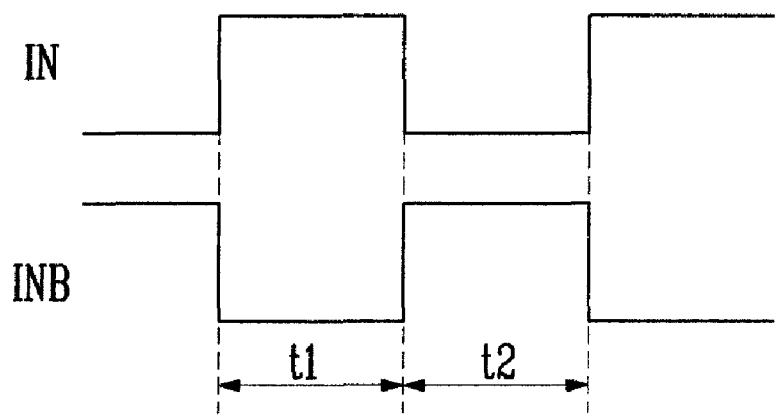
FIG. 2 is a waveform diagram showing a driving process of the level shifter shown in FIG. 1.
Figure 3A:
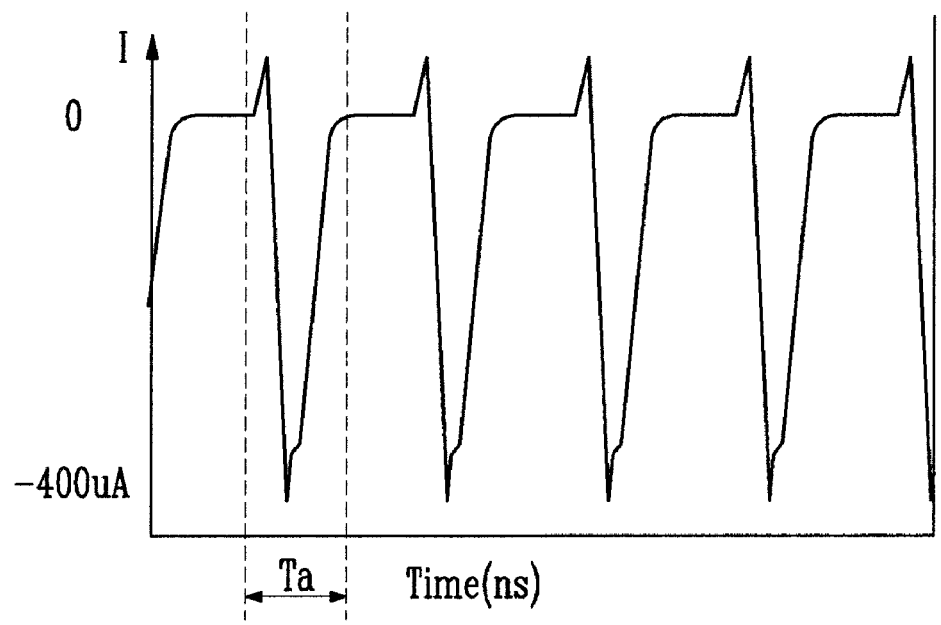
FIGS. 3A and 3B are waveform diagrams showing simulation results when the input signal shown in FIG. 2 is input using the level shifter shown in FIG. 1.
Figure 3B:
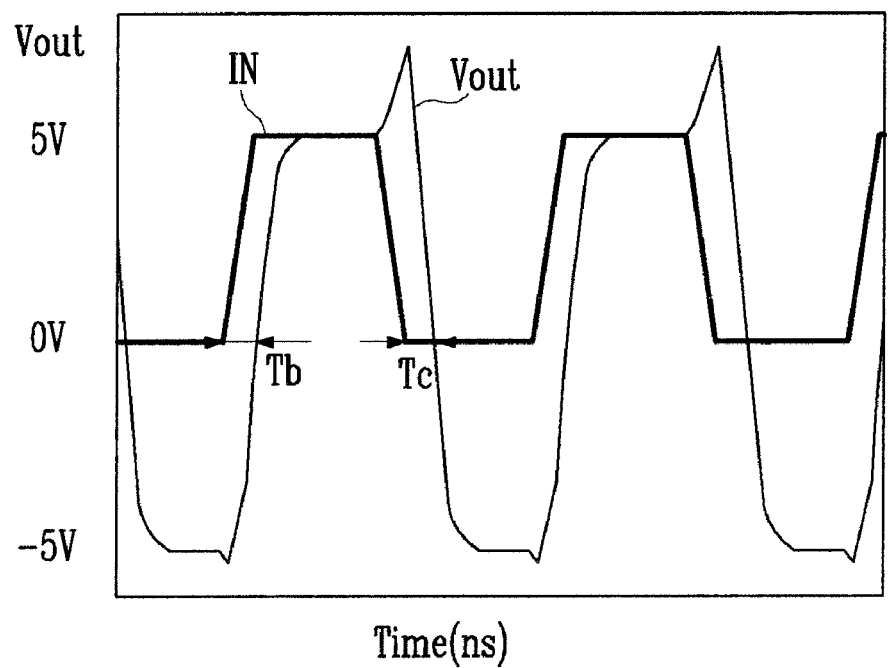

FIG. 1 is a circuit diagram of a level shifter. FIG. 2 is a waveform diagram showing a driving process of the level shifter shown in FIG. 1. FIGS. 3A and 3B are waveform diagrams showing simulation results of the level shifter shown in FIG. 1.

Referring to FIGS. 1 to 3B, the level shifter includes first to fourth transistors (M11, M12, M13, M14) coupled between a first power supply VDDL and a second power supply VSS having a lower voltage level than that of the first power supply VDDL.

The first transistor M11 and the second transistor M12 are serially coupled between the first power supply VDDL and the second power supply VSS and are different types of transistors. For example, if the first transistor M11 is a P-type transistor, the second transistor M12 is an N-type transistor. Here, the gate electrode of the first transistor M11 is coupled to the supply line of a first input signal IN, and the gate electrode of the second transistor M12 is coupled to an output terminal OUT and the drain electrodes of the third and fourth transistors M13 and M14 at node N2.

The third transistor M13 and the fourth transistor M14 are serially coupled between the first power supply VDDL and the second power source VSS and in parallel with the first and the second transistors M11 and M12. The third transistor M13 is a same type transistor as the first transistor M11, that is, a P-type transistor, and the fourth transistor M14 is a same type transistor as the second transistor M12, that is, an N-type transistor. The gate electrode of the third transistor M13 is coupled to the supply line of a second input signal INB which has an inversed polarity of the first input signal IN, and the gate electrode of the fourth transistor M14 is coupled to the first and second transistors M11 and M12 at node N1.

Briefly describing the operating process of the level shifter, first, if the high level first input signal IN and the low level second input signal INB are input to the level shifter during a t1 period, the first transistor M11 is turned off, while the third transistor M13 is turned on. When the third transistor M13 is turned on, the first power supply VDDL and the output terminal OUT of the level shifter are electrically coupled through the third transistor M13 so that the voltage of the output signal Vout becomes a high level voltage of the first power supply VDDL.

Next, when the low level first input signal IN and the high level second input signal INB are input to the level shifter during a t2 period, the first transistor M11 is turned on, while the third transistor M13 is turned off. When the first transistor M11 is turned on, the first power supply VDDL and the gate electrode of the fourth transistor are electrically coupled so that the gate electrode of the fourth transistor M14 is supplied with the high level voltage of the first power supply VDDL. As a result, the fourth transistor M14 is turned on to couple the output terminal OUT to the second power supply VSS so that the voltage of the output signal Vout becomes the low level voltage of the second power supply.

By repeating the foregoing operation, the level shifter outputs the output signal Vout with the high level voltage of the first power supply VDDL and the low level voltage of the second power supply VSS corresponding to the first and second input signals IN and INB to the output terminal OUT.

For example, when the first and second input signals IN and INB are set to 5V to 0V (i.e., 5V in the case of the high level and 0V in the case of the low level) and the voltages of the first power supply VDDL and the second power supply VSS are set to 5V and −5V, respectively, the output signal Vout having in the range of approximately 5V to −5V is output to the output terminal OUT. That is, the level shifter changes the voltage levels of the input signals IN and INB to expand the voltage range.

In such a conventional level shifter, in a transition period where the first and second input signals IN and INB rise from the low level to the high level or fall from the high level to the low level, the first and second transistors M11 and M12 can be concurrently turned on or the third and fourth transistors M13 and M14 can be concurrently turned on, such that leakage current is generated, thereby increasing power consumption.

For example, the first transistor M11 is turned on by the falling first input signal IN and the third transistor M13 is turned off by the rising second input signal INB, at the boundary of the t1 period and the t2 period. At this time, the second transistor M12 temporarily maintains the state of the previous period, that is, the turned-on state in the t1 period. The second transistor M12 is then turned off after the fourth transistor M14 is turned on by the turn-on of the first transistor M11 and the low level voltage of the second power supply VSS is supplied to the gate electrode of the second transistor M12 by the turn-on of the fourth transistor M14. In other words, there is a period in which the first and second transistors M11 and M12 are concurrently turned on in the transition period of the first and second input signals IN and INB. As a result, the leakage current is generated as in a 'Ta' period of FIG. 3A. For substantially the same reason, there is a period in which the third and fourth transistors M13 and M14 are concurrently turned on. As above, in a conventional level shifter, the leakage current in the transition period of the first and second input signals IN and INB causes the problem that power consumption is increased.

Also, since there is a period in which the first and second transistors M11 and M12 are concurrently turned on or the third and fourth transistor M13 and M14 are concurrently turned on, the current driving ability of the first and third transistors M11 and M13 should be higher than that of the second and fourth transistors M12 and M14 in order to operate the circuit. In other words, at the moment when the first transistor M11 or the third transistor M13 is turned on, a first node N1 and a second node N2 are charged with the voltage level close to the voltage level of the first power supply VDDL and the second and fourth transistors M12 and M14 coupled thereto in series are turned off. At this time, in order to stabilize the output voltage Vout, the current driving ability of the first and third transistors M11 and M13 is higher than that of the second and fourth transistors M12 and M14. In particular, since the P-type transistor is lower in the current driving ability as compared to the N-type transistor, the magnitude of width/length (W/L) of the first and third transistors M11 and M13 is designed to be even larger in order to increase the current driving ability of the first and third transistors M11 and M13. However, due to such an implementation, the area occupied by the first and third transistors M11 and M13 is large, and the capacitance experienced by the first and second input signals IN and INB is large so that the delay time required for the rise and fall of the voltage of the first and second input signals IN and INB is increased.

Also, in the conventional level shifter, the delay time generated in a path for supplying the high level voltage of the first power supply VDDL to the output terminal OUT and the delay time generated in a path for supplying the low level voltage of the second power supply VSS to the output terminal OUT are different.

In more detail, in the t1 period, the first power supply VDDL and the output terminal OUT are electrically coupled through the third transistor M13, which is turned on in response to the low level second input signal INB. On the other hand, in the t2 period, the fourth transistor M14 is turned on to couple the second power supply VSS to the output terminal OUT after the high level voltage is supplied to the gate electrode of the fourth transistor M14 through the first transistor M11, which is turned on in response to the low level first input signal IN. As a result, in the t1 period and the t2 period, the delay time of the output signal Vout is different. In other words, the conventional level shifter causes the problem in that the delay time Tb required for the rise of the output signal Vout does not conform to the delay time Tc required for the fall of the output signal Vout, and the delay time is long, as shown in FIG. 3B.

Figure 4:
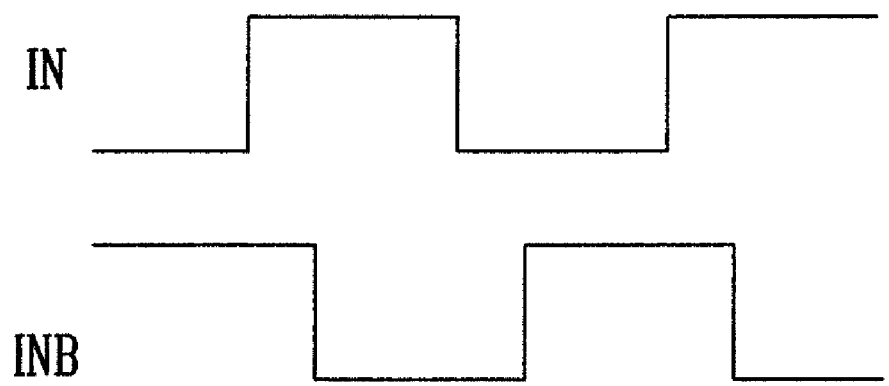
FIG. 4 is a waveform diagram showing a driving process when the delayed input signal is input using the level shifter shown in FIG. 1.

FIG. 2 shows an ideal waveform without the delay of the second input signal INB. However, since the second input signal INB is generated by inverting the first input signal IN, the rising time or the falling time of the second input signal INB does not actually conform to the rising time or the falling time of the first input signal IN due to the signal delay generated in this process, as shown in FIG. 4.

Figure 5A:
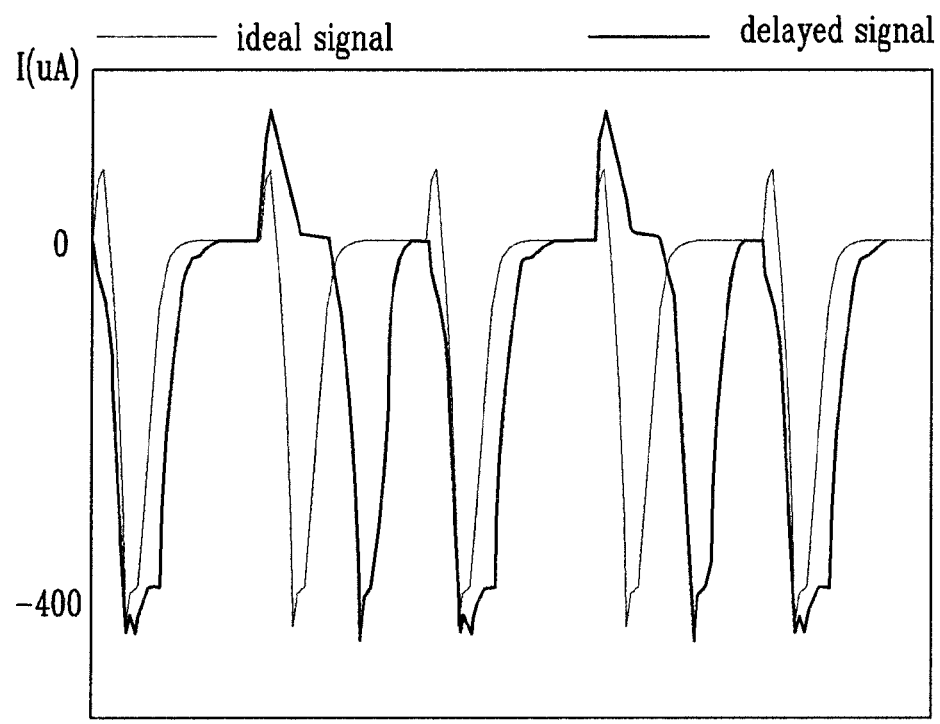
FIGS. 5A and 5B are waveform diagrams showing simulation results when the input signal shown in FIG. 4 is input using the level shifter shown in FIG. 1.
Figure 5B:
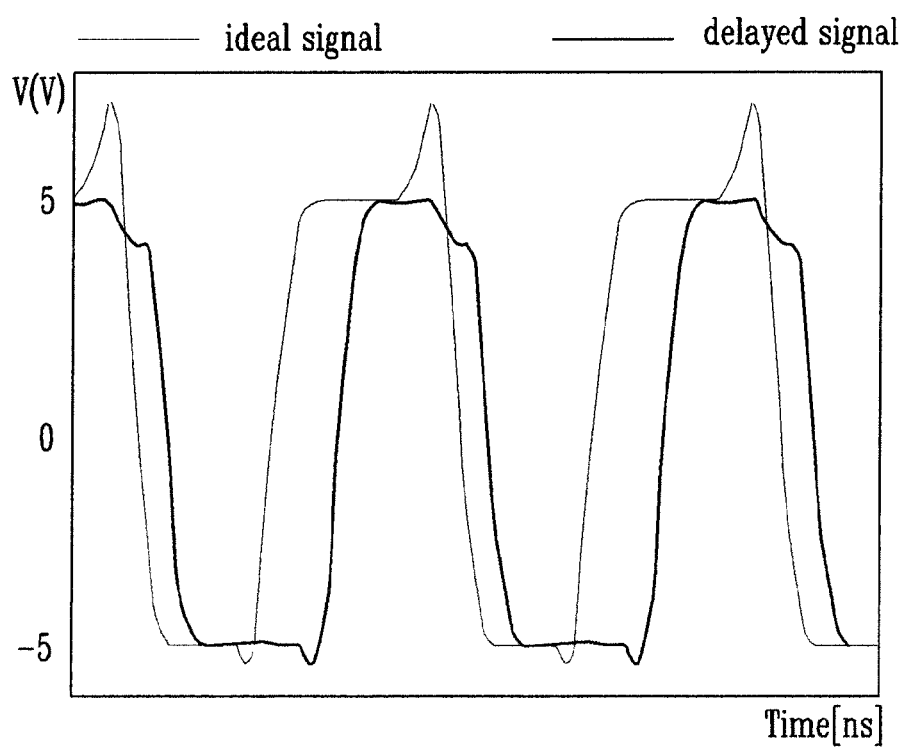

In this case, an increased leakage current is generated as compared to the case where the ideal input signals IN and INB without the delay are supplied, as shown in FIG. 5A in addition to the delay time being further increased as shown in FIG. 5B.

Figure 6:
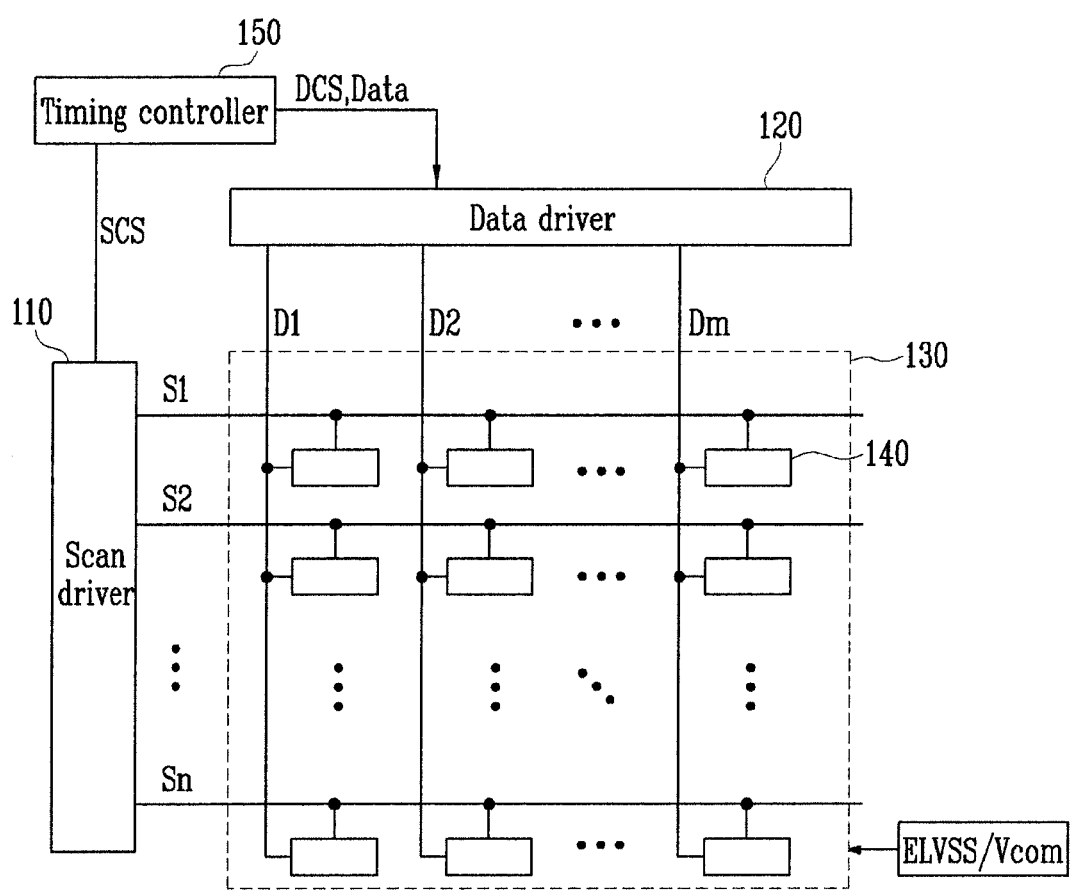
FIG. 6 is a block diagram showing a flat panel display according to an exemplary embodiment of the present invention.

FIG. 6 is a block diagram showing a flat panel display according to an embodiment of the present invention.

Referring to FIG. 6, the flat panel display according to the described embodiment of the present invention includes a display region 130 having pixels 140 positioned at the crossing portions ("crossings") between scan lines S1 to Sn and data lines D1 to Dm; a scan driver 110 for driving the scan lines S1 to Sn; a data driver 120 for driving the data lines D1 to Dm; and a timing controller 150 for controlling the scan driver 110 and the data driver 120.

The scan driver 110 is supplied with a scan driving control signal SCS from the timing controller 150. The scan driver 110 then generates the scan signals and sequentially supplies the generated scan signals to the scan lines S1 to Sn.

The data driver 120 is supplied with a data driving control signal DCS and Data from the timing controller 150. The data driver 120 then generates the data signals and supplies the generated data signals to the data lines D1 to Dm in synchronization with the scan signals.

The timing controller 150 generates the data driving control signal DCS and the scan driving control signal SCS corresponding to the synchronization signal supplied from the outside. The data driving control signal DCS generated from the timing controller 150 is supplied to the data driver 120 and the scan driving control signal SCS is supplied to the scan driver 110. Here, the data driving control signal DCS may include a source start pulse, a source shift clock, and a source output enable signal, etc. The scan driving control signal SCS may include a gate start pulse, a gate shift clock, and a gate output enable signal, etc.

The display region 130 includes the plurality of pixels 140 located at the crossing portions of the scan lines S1 to Sn and the data lines D1 to Dm. Each of the pixels 140 is selected when the scan signal is supplied to the scan line S coupled to the pixel, and emits light with brightness corresponding to the data signal supplied from the data line D to the outside so that an image is displayed on the display region 130.

The flat panel display depicted in FIG. 6, for example, can be a liquid crystal display, an organic light emitting display, etc.

Figure 7:
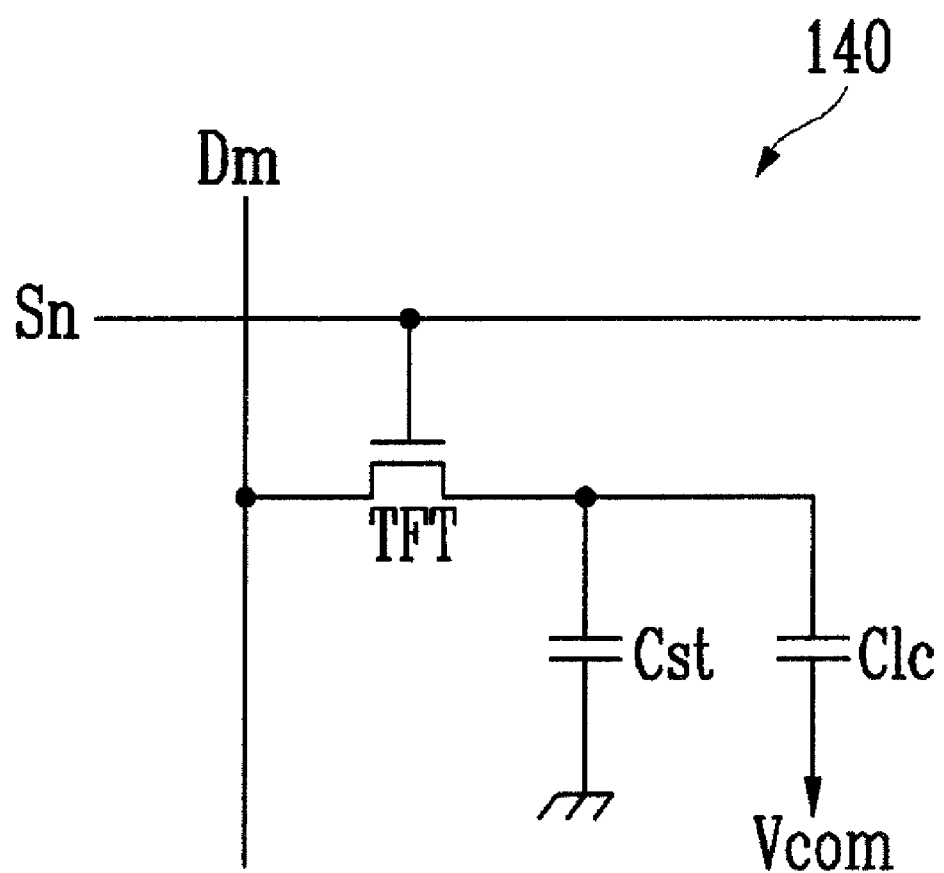
FIG. 7 is a circuit diagram showing one example of a pixel when the flat panel display shown in FIG. 6 is a liquid crystal display.

FIG. 7 is a circuit diagram showing one example of a pixel when the flat panel display shown in FIG. 6 is a liquid crystal display. FIG. 7 shows the pixel coupled to an n-th scan line Sn and an m-th data line Dm for the convenience of description.

Referring to FIG. 7, the pixel 140 includes a thin film transistor (hereinafter, referred to as TFT) coupled to the scan line Sn and the data line Dm and a storage capacitor Cst and a liquid crystal capacitor Clc.

The first electrode of the TFT is coupled to the data line Dm and the second electrode of the TFT is coupled to one electrode of the storage capacitor Cst and the liquid capacitor Clc. Here, for example, the first electrode of the TFT is a drain electrode and the second electrode of the TFT is a source electrode. The gate electrode of the TFT is coupled to the scan line Sn. The TFT is turned on when the scan signal is supplied to the scan line Sn to supply the data signal supplied from the data line Dm to the storage capacitor Cst.

The storage capacitor Cst stores the voltage corresponding to the data signal supplied via the TFT and maintains the stored voltage during one frame.

The liquid crystal capacitor Clc equivalently represents liquid crystals between a common electrode (not shown) and a pixel electrode (not shown) coupled to the second electrode of the TFT. The liquid crystal capacitor Clc controls the light transmittance of the liquid crystal in accordance with the voltage stored in the storage capacitor Cst.

The structure of the pixel 140 shown in FIG. 7 is one embodiment of the present invention and the present invention is not limited thereto. In practice, the structure of the pixel 140 can be variously changed as long as it includes at least one TFT.

Figure 8:
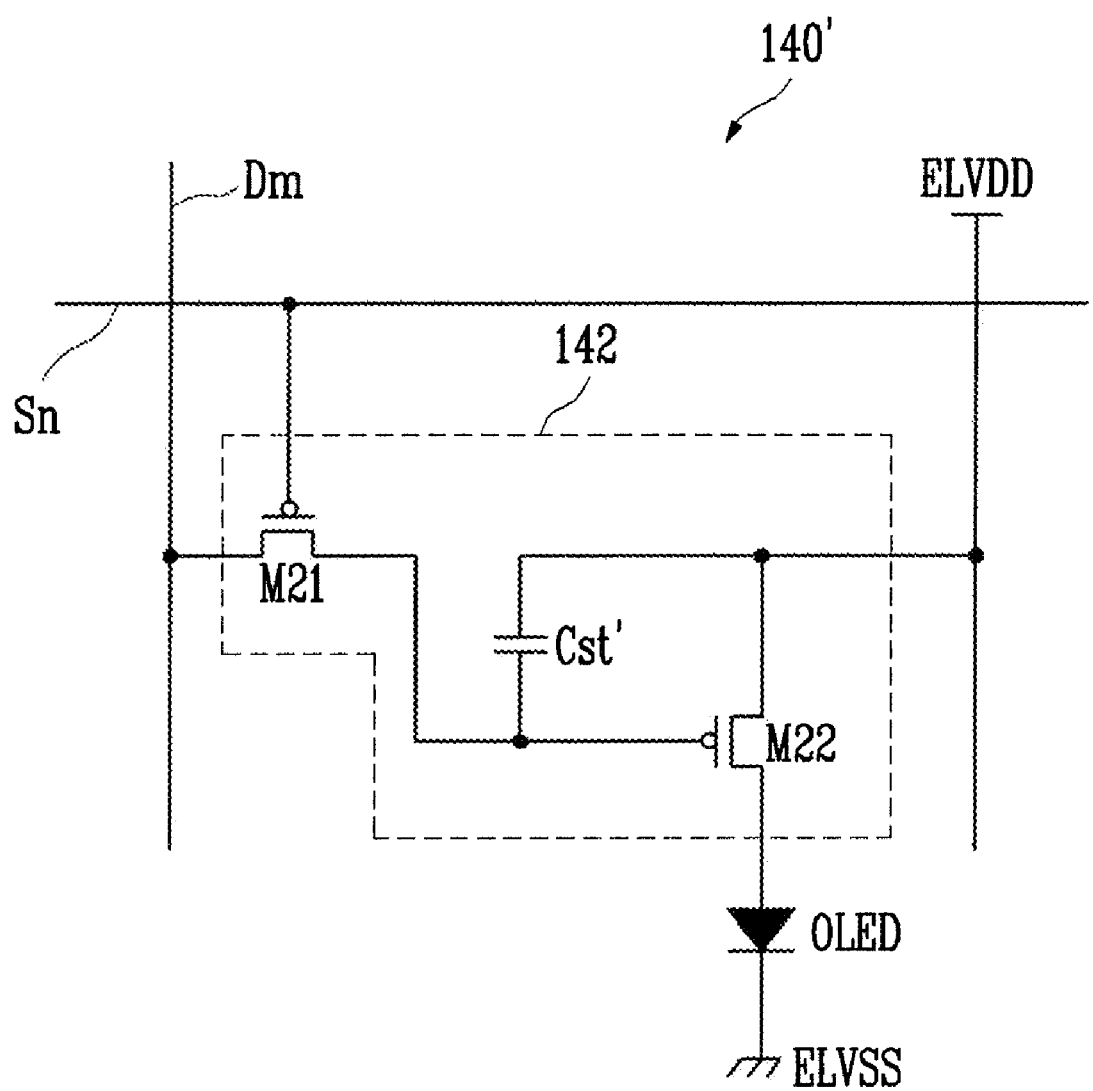
FIG. 8 is a circuit diagram showing one example of a pixel when the flat panel display shown in FIG. 6 is an organic light emitting display.

FIG. 8 is a circuit diagram showing one example of a pixel when the flat panel display shown in FIG. 6 is an organic light emitting display. FIG. 8 shows only the pixel coupled to the n-th scan line Sn and the m-th data line Dm for the convenience of description.

Referring to FIG. 8, the pixel 140' is coupled to the organic light emitting diode OLED, the data line Dm, and the scan line Sn and includes a pixel circuit 142 for controlling the organic light emitting diode OLED.

The anode electrode of the organic light emitting diode OLED is coupled to the pixel circuit 142 and the cathode electrode of the organic light emitting diode OLED is coupled to a second pixel power supply ELVSS. The organic light emitting diode OLED generates light with brightness corresponding to a current supplied by the pixel circuit 142.

The pixel circuit 142 controls the amount of current supplied to the organic light emitting diode OLED in accordance with the data signal supplied from the data line Dm when the scan signal is supplied to the scan line Sn. To this end, the pixel circuit 142 includes a first transistor M21 coupled to the scan line Sn and the data line Dm; a second transistor M22 coupled between the first pixel power supply ELVDD and the anode electrode of the organic light emitting diode OLED; and a storage capacitor Cst' coupled between the gate electrode and the source electrode of the second transistor M22.

The first electrode of the first transistor M21 is coupled to the data line Dm and the second electrode thereof is coupled to the gate electrode of the second transistor M22 and one electrode of the storage capacitor. Here, for example, the first electrode of the first transistor M21 is the source electrode and the second electrode of the first transistor M21 is the drain electrode. Further, the gate electrode of the first transistor M21 is coupled to the scan line Sn. The first transistor M21 is turned on when the scan signal is supplied from the scan line Sn to supply the data signal supplied from the data line Dm to the storage capacitor Cst'. At this time, the storage capacitor Cst' charges a voltage corresponding to the data signal.

The first electrode of the second transistor M22 is coupled to the first pixel power supply ELVDD and the second electrode of the second transistor M22 is coupled to the anode electrode of the organic light emitting diode OLED. The gate electrode of the second transistor M22 is coupled to one electrode of the storage capacitor Cst'. The second transistor M22 controls the amount of current that flows to the second pixel power supply ELVSS via the organic light emitting diode OLED from the first pixel power supply ELVDD in accordance with the voltage stored in the storage capacitor Cst'. At this time, the organic light emitting diode OLED generates light corresponding to the amount of current supplied from the second transistor M22.

The structure of the pixel 140' shown in FIG. 8 is only an embodiment for providing an example of the present invention, but the present invention is not limited thereto. In practice, the structure of the pixel 140' can be variously changed to include a plurality of transistors.

Figure 9:
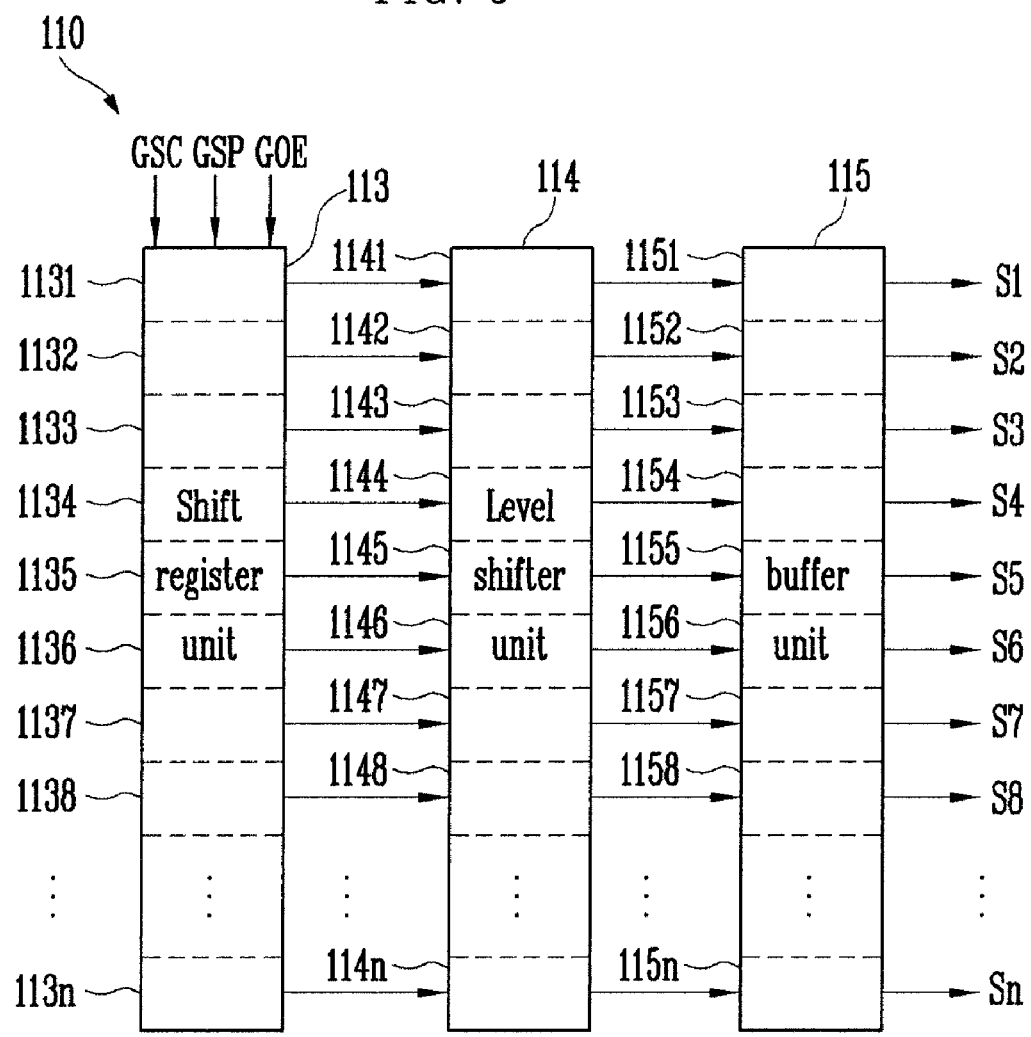
FIG. 9 is a block diagram showing one example of a scan driver shown in FIG. 6.

FIG. 9 is a block diagram showing one example of the scan driver shown in FIG. 6. In FIG. 9, it is assumed that the scan driver has n channels for the convenience of description.

Referring to FIG. 9, the scan driver 110 includes a shift register unit 113 for sequentially generating scan signals; a level shifter unit 114 for expanding the voltage range of the scan signals generated from the shift register unit 113; and a buffer unit 115 for supplying the scan signals supplied from the level shifter unit 114 to the scan lines S1 to Sn.

The shift register unit 113 is supplied with gate shift clock GSC, gate start pulse GSP, and gate output enable GOE signals from the timing controller 150. The shift register unit 113 shifts the gate start pulse GSP in response to the gate shift clock GSC and at the same time, sequentially generates n sampling pulses. Further, the shift register unit 113 sequentially generates the n scan signals by the logical combination of the generated sampling pulses and the gate output enable GOE. To this end, the shift register unit 113 includes n shift registers 1131 to 113N.

The level shifter unit 114 amplifies the voltage of the scan signal supplied by the shift register unit 113. In other words, the level shifter unit 114 expands the voltage range of the scan signal to stably drive the pixel 140. As one example, when the scan signal of 0V to 5V is supplied, the level shifter unit 114 expands the voltage range to −5V to 5V. To this end, the level shifter unit 114 includes n level shifters 1141 to 114n. The scan signal with the expanded voltage range is supplied to the buffer unit 115.

The buffer unit 115 supplies the scan signals supplied from the level shifter unit 114 to the scan lines S1 to Sn. The buffer unit 115 can be removed in a design process. In other words, in other embodiments, the buffer unit 115 may be not used. In such cases, the level shifter unit 114 may be coupled directly to the scan lines S1 to Sn.

Figure 10:
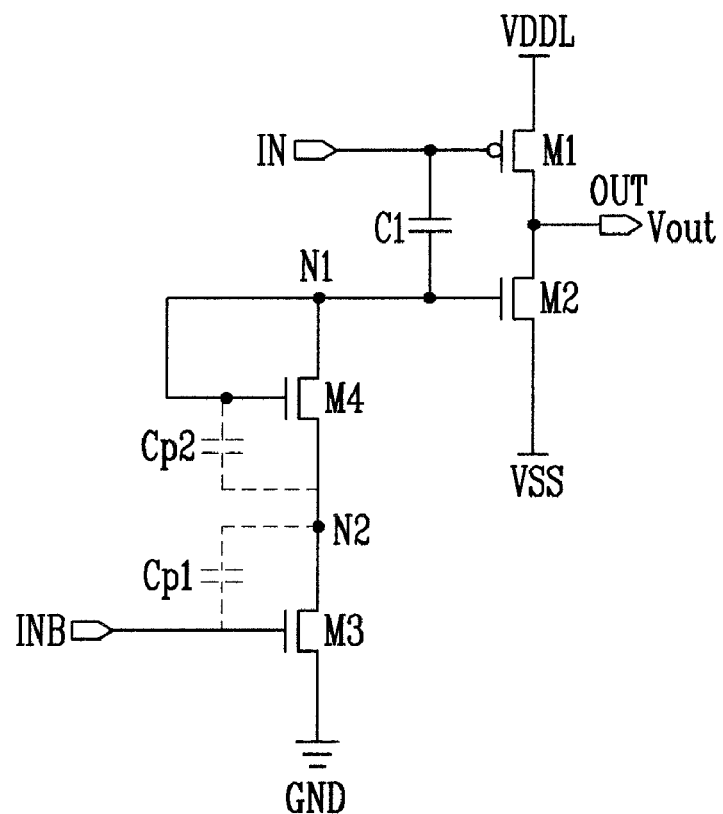
FIG. 10 is a circuit diagram showing one example of a level shifter included in a level shifter unit shown in FIG. 9.

FIG. 10 is a circuit diagram showing one example of a level shifter included in a level shifter unit shown in FIG. 9. FIG. 10 shows a level-down shifter for expanding the voltage range by lowering the low level voltage value of the input signal for the convenience of description, but the present invention is not limited thereto.

Referring to FIG. 10, the level shifter according to one exemplary embodiment includes: first and second transistors M1 and M2 serially coupled between a first power supply VDDL and a second power supply VSS having a lower voltage level than that of the first power supply VDDL; a first capacitor C1 coupled between a gate electrode of the first transistor M1 and a gate electrode of the second transistor M2; an input line of a first input signal IN coupled to the gate electrode of the first transistor M1 and a first electrode of the first capacitor C1; a third transistor M3 coupled between a second electrode of the first capacitor C1 and a third power supply GND, the gate electrode of the third transistor M3 being coupled to an input line of a second input signal INB; and a fourth transistor M4 coupled between the second electrode of the first capacitor C1 and the third transistor M3, the gate electrode of the fourth transistor M4 being coupled to one electrode of the fourth transistor M4 that is coupled to the second electrode of the first C1, such that the fourth transistor M4 is diode-connected. The transistors M1 and M2 have different transistor types. In other embodiments, the first input signal IN may be provided to the gate of the second transistor M2. Those skilled in the art would know how the circuit of FIG. 10 should be adjusted in such cases.

In more detail, the first transistor M1 is a P-type transistor and the gate electrode of the first transistor M1 is coupled to the input line of the first input signal IN. The first electrode of the first transistor M1 is coupled to the first power supply VDDL and the second electrode of the first transistor M1 is coupled to the second transistor M2 and the output terminal OUT. Here, for example, the first electrode of the first transistor M1 is the source electrode and the second electrode of the first transistor M1 is the drain electrode. The first transistor M1 is turned off when a high level first input signal IN is input and is turned on when a low level first input signal IN is input so that the first power supply VDDL and the output terminal OUT are electrically coupled.

The first electrode of the first capacitor C1 is coupled to the input line of the first input signal IN and the gate electrode of the first transistor M1, and the second electrode of the first capacitor C1 is coupled to the first node N1 to which the gate electrode of the second transistor M2 is coupled. The first capacitor C1 stores a voltage corresponding to the voltage difference between the voltages respectively supplied to its two electrodes. While the first node N1 is in a floating state, the first capacitor C1 performs a coupling action to change the voltage of the first node N1 in accordance with the change of the first input signal IN.

The second transistor M2 is an N-type transistor and the gate electrode of the second transistor M2 is coupled to the first node N1. The first electrode of the second transistor M2, for example, the drain electrode, is coupled to the first transistor M1 and the output terminal OUT, and the second electrode of the second transistor M2, for example, the source electrode, is coupled to the second power supply VSS. Here, the second power supply VSS is a power supply having a lower voltage level than that of the first power supply VDDL. The second transistor M2 is turned off when the first node N1 is charged with a low level voltage and is turned on when the first node N1 is charged with a high level voltage so that the output terminal OUT and the second power supply VSS are electrically coupled.

The third transistor M3 and the fourth transistor M4 are serially coupled between the first node N1 and the third power supply GND and are same type transistors as the second transistor M2. In other words, the third and fourth transistors M3 and M4 are N-type transistors. Here, the voltage level of the third power supply GND is set to a value between the voltage level of the first power supply VDDL and the voltage level of the second power supply VSS, for example, to the ground voltage.

In more detail, the third transistor M3 is positioned between the second node N2 and the third power supply GND and is electrically coupled to the first node N1 through the fourth transistor M4 when the fourth transistor M4 is turned on. In other words, the first electrode of the third transistor M3 is coupled to the fourth transistor M4 and the second electrode of the third transistor M3 is coupled to the third power supply GND. The gate electrode of the third transistor M3 is coupled to the input line of the second input signal INB. Here, the second input signal INB is a signal generated by inverting the first input signal IN. The third transistor M3 is turned on or turned off in accordance with the voltage difference between the second input signal INB and the source electrode of the third transistor M3 to control whether the second node N2 and the third power supply GND are electrically coupled.

The first electrode of the fourth transistor M4 is coupled to the first node N1 and the second electrode of the fourth transistor M4 is coupled to the first electrode of the third transistor M3. The gate electrode of the fourth transistor M4 is coupled to the first node N1. In other words, the gate electrode of the fourth transistor M4 is coupled to the first electrode of the fourth transistor M4 so that the fourth transistor is diode-connected. The fourth transistor M4 maintains the voltage difference between its first electrode and its second electrode by the voltage corresponding to the threshold voltage Vth4 thereof when a forward voltage is supplied. Further, the fourth transistor M4 is turned off when a reverse voltage is supplied.

Hereinafter, the driving process of the level shifter shown in FIG. 10 will be described in detail in reference to FIG. 10 and FIG. 11, which is a waveform diagram showing the driving process of the level shifter shown in FIG. 10. Here, the second input signal INB is generated by inverting the first input signal IN. Accordingly, the second input signal INB has an opposite waveform to the first input signal IN. Further, the transition time of the second input signal INB, that is, the rising and falling times of the second input signal INB, is shown as delayed in comparison to the transition time of the first input signal IN, that is, the rising and falling times of the first input signal IN. For the convenience of description, it is assumed that the high level voltage of the first and second input signals IN and INB and the voltage of the first power supply VDDL are 5V and the low level voltage of the first and second input signals IN and INB and the voltage of the third power supply GND are 0V. Further, it is assumed that the voltage of the second power supply VSS is −5V.

Figure 11:
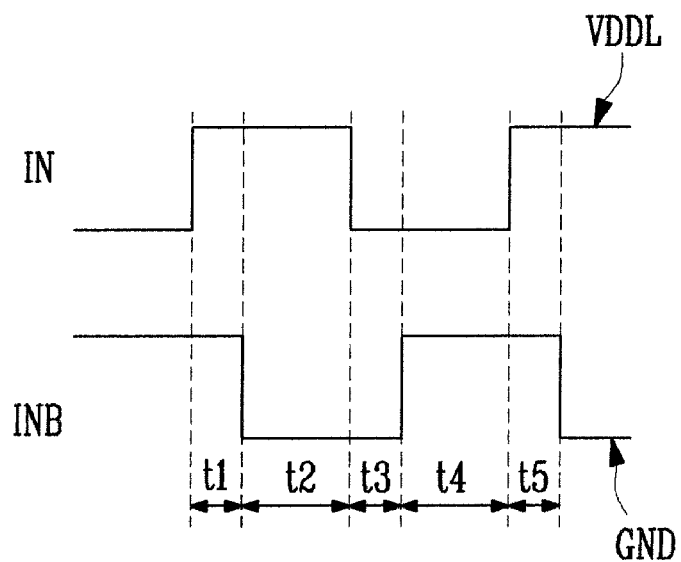
FIG. 11 is a waveform diagram showing the driving process of the level shifter shown in FIG. 10.

Referring to FIG. 11, first, the first input signal IN rises from 0V to 5V during a t1 period to have a value of 5V while the second input signal INB is maintained at a previous value of 5V due to a signal delay. Then, the voltage difference between the gate and source of the first transistor M1 becomes 0V corresponding to the first input signal IN so that the first transistor M1 is turned off. On the other hand, the third transistor M3 supplied with the second input signal INB of 5V maintains the turned-on state so that the second node N2 is charged with 0V. At this time, the forward voltage is supplied to the fourth transistor M4 so that the voltage difference between the first electrode and the second electrode of the fourth transistor M4 is maintained at the threshold voltage Vth4 of the fourth transistor M4. Therefore, the first node N1 is charged with the threshold voltage Vth4 of the fourth transistor M4. Then, the voltage difference between the gate and source of the second transistor M2 becomes the difference of −5V between the threshold voltage Vth4 of the fourth transistor and the second power supply VSS, that is, (Vth4−(−5))V so that the second transistor M2 is turned on. As a result, the output terminal OUT and the second power supply VSS are electrically coupled so that the output voltage Vout becomes −5V. At this time, the first capacitor C1 is stored with the voltage difference (5−Vth4)V between the two electrodes thereof.

Thereafter, the first input signal IN maintains the voltage value of 5V during a t2 period and the second input signal INB falls from 5V to 0V to have the voltage value of 0V. Then, the third transistor M3 is turned off in response to the second input signal INB of 0V. When the third transistor M3 is turned off, the second node N2 is floated. If the second node N2 is floated, then the voltage drop occurs in the second node N2 due to the coupling action of the parasitic capacitors Cp1 and Cp2 existing in the third transistor M3 and the fourth transistor M4. At this time, the voltage of the second node N2 is represented by the following equation 1 because of the voltage distribution of the parasitic capacitors Cp1 and Cp2.

$$V_{N2} = \frac{Cp1}{Cp1 + Cp2} \times \Delta V_{INB} \quad \text{[Equation 1]}$$

Here, $\Delta V_{INB}$ is −5V so that the voltage value $V_{N2}$ of the second node N2 becomes smaller than 0. At this time, if the voltage drop of the second node N2 is (Vx)V, the voltage value $V_{N2}$ of the second node N2 is (0−Vx)V, that is, (−Vx)V. However, −Vx has a value larger than −Vth3 (the threshold voltage of the third transistor) (that is, an absolute value of −Vx is smaller than that of −Vth3). This reason is as follows. If the voltage drop is large to drop the voltage value −Vx of the second node N2 to −Vth3, the drain electrode and the source electrode of the third transistor M3 are changed so that the voltage between the gate and source of the third transistor M3 is more than the threshold voltage Vth3 to turn on the third transistor M3. In this case, the second node N2 is charged up to −Vth3 because of the third power supply GND so that it will be turned off again. Accordingly, the voltage $V_{N2}$ of the second node N2 is determined between −Vth3<−Vx<0 according to one exemplary embodiment.

Since the fourth transistor M4 is diode-connected, if the voltage value of the second node N2 is (−Vx)V, the voltage value of the first node N1 becomes (Vth4−Vx)V.

In this case, the first transistor M1 maintains an off state in response to the first input signal INB of 5V. At this time, the voltage difference between the gate and source of the second transistor M2 is ((Vth4−Vx)−(−5))V so that the second transistor M2 maintains the turned-on state. Therefore, the output voltage Vout is maintained at −5V. On the other hand, during the t2 period, the first capacitor C1 is charged with the voltage of (5−(Vth4−Vx))V that is the voltage difference between the two electrodes of the first capacitor C1.

Thereafter, during a t3 period, the first input signal IN falls from 5V to 0V to have a voltage value of 0V and the second input signal INB maintains a voltage value of 0V. Then, the voltage value of the first capacitor C1 lowers the voltage value of the first node N1 to (Vth4−Vx−5)V because of the coupling action of the first capacitor C1. Thereby, the diode-connected fourth transistor M4 is applied with the reverse voltage to maintain the turn-off state of the fourth transistor M4. Therefore, the reverse current through the coupling action of the parasitic capacitors Cp1 and Cp2 is suppressed so that the voltage of the floated first node N1 is maintained at (Vth4−Vx−5)V. Then, the voltage value between the gate and source of the second transistor M2 becomes ((Vth4−Vx−5)−(−5))V, that is, (Vth4−Vx)V so that the second transistor M2 is turned off. Meanwhile, the first transistor M1 is turned on in response to the first input signal IN of 0V so that the first power supply VDDL and the output terminal OUT are electrically coupled to make the output voltage Vout+5V.

Thereafter, during a t4 period, the first input signal IN maintains a voltage value of 0V and the second input signal INB rises from 0V to 5V to have a voltage value of 5V. Then, the third transistor M3 is turned on so that the second node N2 is charged with 0V again. However, even in this case, the fourth transistor M4 is supplied with the reverse voltage so that the fourth transistor M4 maintains the turned-off state. As a result, the voltage value of the first node N1 is maintained at the same value as the t3 period so that the second transistor M2 is turned off. On the other hand, the first transistor M1 maintains the turned-on state in response to the first input signal IN of 0V so that the output voltage Vout is maintained at +5V.

Thereafter, during a t5 period, the first input signal IN rises from 0V to 5V to have a value of 5V and the second input signal INB maintains a value of 5V. Then, the first transistor M1 is turned off, while the voltage value of the first node N1 becomes (Vth4−Vx)V because of the coupling action of the first capacitor C1 to turn on the second transistor M2. As a result, the output voltage Vout has a voltage value of −5V.

The level shifter repeats the foregoing operations to output the output signal Vout having the voltage range of −5V to 5V corresponding to the first and second input signals IN and INB having the voltage range of 0V to 5V. In other words, the level shifter expands the voltage range of the input signals IN and INB to output them.

Figure 12A:
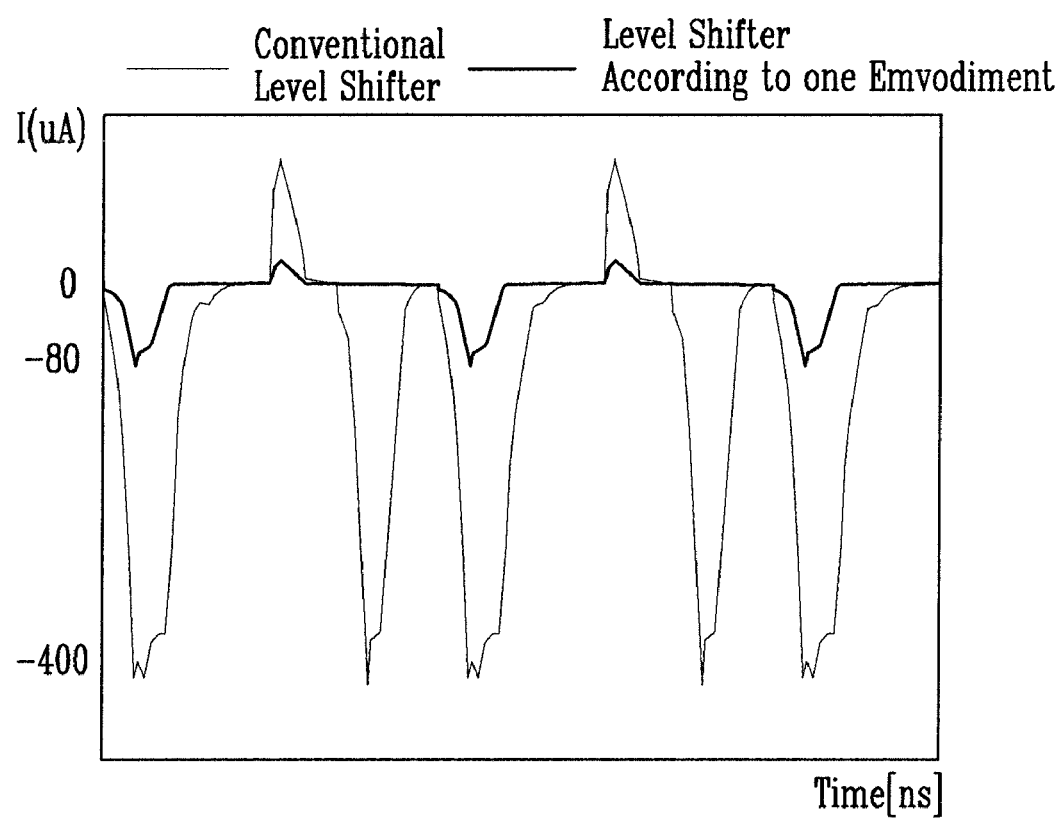
FIGS. 12A and 12B are waveform diagrams showing the simulation results of the level shifter shown in FIG. 10.

With the above-mentioned level shifter in accordance with an embodiment of the present invention, the concurrent turn-on of the first transistor M1 and the second transistor M2 can be prevented. The level shifter according to the described embodiment takes into consideration the delay between the first input signal IN and the second input signal INB, such that only one of the first transistor M1 and the second transistor M2 is turned on at any given time. Therefore, as shown in FIG. 12A, for the same input, the amount of leakage current is reduced and power consumption is reduced accordingly, as compared to a conventional level shifter.

Further, since the level shifter is not operated by the difference in the current driving ability of the first and second transistors M1 and M2, the size, i.e., the width-to-length ratio (W/L), of the transistor does not need to be large. Therefore, the area occupied by the level shifter in the driving circuit is reduced, in addition to preventing the increase in the delay time required when the voltage levels of the input signals IN and INB are changed.

Figure 12B:
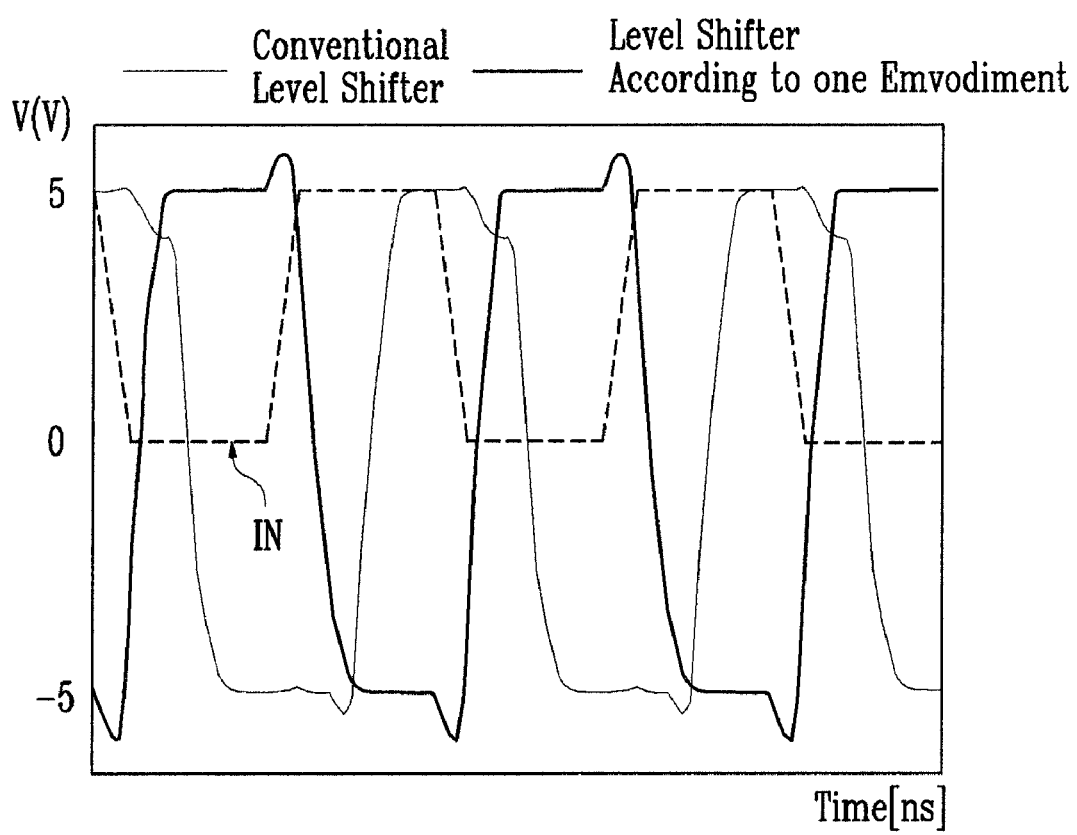

Also, the output terminal OUT and the first power supply VDDL are coupled via the first transistor M1, while the output terminal OUT and the second power supply VSS are coupled via the second transistor M2. Therefore, the delay time of the signal generated in the path for supplying the voltage of the first power supply VDDL to the output voltage OUT and the delay time of the signal generated in the path for supplying the voltage of the second power supply VSS are approximately the same. Therefore, as shown in FIG. 12B, unlike the conventional level shifter that makes the delay times required for the rise and fall of the output signal Vout to be different, in the described embodiment the delay times required for the rise and fall of the output signal Vout are approximately the same. Further, the delay time can be reduced to be similar to the shorter delay time of the delay times required for the rise and fall of the output signal Vout in the conventional level shifter. Here, the level shifter of the described embodiment is not a non-inverting type level shifter as the conventional level shifter, but is an inverting type level shifter that inverts and outputs the first input signal IN. As such, the level shifter of the described embodiment according to the present invention outputs the output voltage Vout with a phase opposite to the phase of the first input signal IN. However, the present invention is not limited thereto.

Also, the diode-connected fourth transistor M4 is used so that the first node N1 is floated to prevent the reverse current from being generated, making it possible to secure the reliability of operation.

Figure 13:
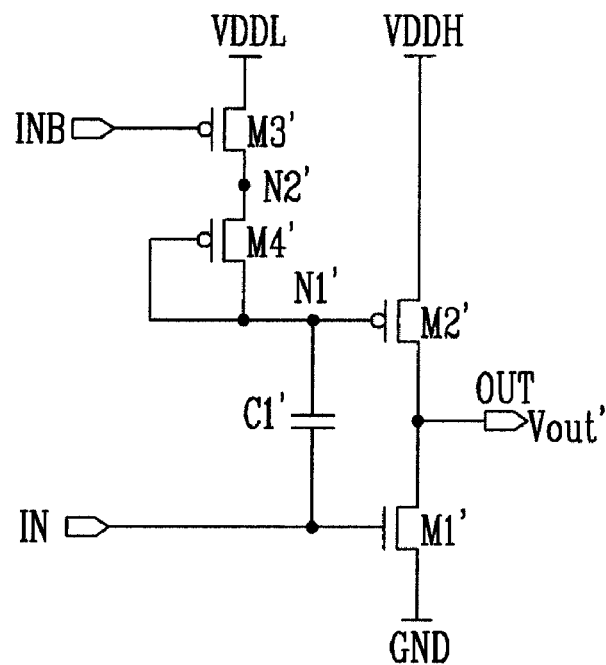
FIG. 13 is a circuit diagram showing another example of the level shifter included in the level shifter unit shown in FIG. 9.

FIG. 13 is a circuit diagram showing another example of the level shifter included in the level shifter unit shown in FIG. 9. FIG. 13 shows a level-up shifter for expanding the voltage range by raising the high level voltage of the input signal.

Referring to FIG. 13, the level shifter according to another embodiment of the present invention is serially coupled between a first power supply VDDH and a second power supply GND with a lower voltage level than that of the first power supply VDDH. The level shifter includes: first and second transistors M1' and M2' that are different type transistors; a first capacitor C1' coupled between a gate electrode of the first transistor M1' and a gate electrode of the second transistor M2'; an input line of a first input signal IN coupled to the gate electrode of the first transistor M1' and a first electrode of the first capacitor C1'; a third transistor M3' positioned between a second electrode of the first capacitor C1' and a third power supply VDDL, the gate electrode of the third transistor M3' being coupled to an input line of a second input signal INB; and a fourth transistor M4' coupled between the second electrode of the first capacitor C1' and the third transistor M3', the gate electrode of the fourth transistor M4' being coupled to one electrode of the fourth transistor M4' that is coupled to the second electrode of the first capacitor C1', such that the fourth transistor M4' is diode-connected. In other embodiments, the first input signal IN may be provided to the gate of the second transistor M2'. Those skilled in the art would know how the circuit of FIG. 13 should be adjusted in such cases.

In more detail, the first transistor M1' is an N-type transistor and the gate electrode of the first transistor M1' is coupled to the input line of the first input signal IN. Further, the first electrode of the first transistor M1' is coupled to the second transistor M2' and the output terminal OUT, and the second electrode of the first transistor M1' is coupled to the second power supply GND. Here, for example, the first electrode of the transistor M1' is a drain electrode and the second electrode of the transistor M1' is a source electrode. Further, the second power supply GND is a power supply with a lower voltage value than that of the first power supply VDDH, for example, the voltage of the second power supply GND can be set to the ground voltage. The first transistor M1' is turned off when a low level first input signal IN is input and is turned on when a high level first input signal IN1 is input so that the second power supply GND and the output terminal OUT are electrically coupled.

The first electrode of the first capacitor C1' is coupled to the input line of the first input signal IN and the gate electrode of the first transistor M1', and the second electrode of the first capacitor C1' is coupled to the first node N1' to which the gate electrode of the second transistor M2' is coupled. The first capacitor C1' stores the voltage value corresponding to a voltage difference between voltages supplied to its two electrodes. Further, while the first node N1' is in a floating state, the capacitor C1' performs a coupling action to change the voltage of the first node N1' in accordance with the change of the first input signal IN.

The second transistor M2' is a P-type transistor and the gate electrode of the second transistor M2' is coupled to the first node N1'. The first electrode of the second transistor M2' is coupled to the first power supply VDDH and the second electrode of the second transistor M2' is coupled to the output terminal OUT and the first transistor M1'. The second transistor M2' is turned on when the first node N1' is charged with a low level voltage so that the output terminal OUT and the first power supply VDDH are electrically coupled.

The third transistor M3' and the fourth transistor M4' are serially coupled between the first node N1' and the third power supply VDDL. The third and fourth transistors M3' and M4' are same type transistors as the second transistor M2', in other words, they are P-type transistors. Here, the voltage value of the third power supply VDDL is set to a value between the voltage value of the first power supply VDDH and the voltage value of the second power supply GND.

In more detail, the third transistor M3' is coupled between the second node N2' and the third power supply VDDL. The third transistor M3' is electrically coupled to the first node N1' through the fourth transistor M4' when the fourth transistor M4' is turned on. In other words, the first electrode of the third transistor M3' is coupled to the third power supply VDDL and the second electrode of the third transistor M3' is coupled to the fourth transistor M4'. The gate electrode of the third transistor M3' is coupled to the input line of the second input signal INB. Here, the second input signal INB is a signal generated by inverting the first input signal IN. The third transistor M3' is turned on or turned off in accordance with the voltage difference between the second input signal INB and the source electrode of the third transistor M3' to control whether the third power supply VDDL and the second node N2' are electrically coupled to each other.

The first electrode of the fourth transistor M4' is coupled to the third transistor M3' and the second electrode of the fourth transistor M4' is coupled to the first node N1'. Further, the gate electrode of the fourth transistor M4' is coupled to the first node N1'. In other words, the gate electrode of the fourth transistor M4' is coupled to the second electrode of the fourth transistor M4' so that the fourth transistor M4' is diode-connected. The fourth transistor M4' maintains a voltage difference between its first electrode and its second electrode by the voltage corresponding to the threshold voltage Vth4' thereof when forward voltage is supplied. The fourth transistor M4' is turned off when a reverse voltage is supplied.

Figure 14:
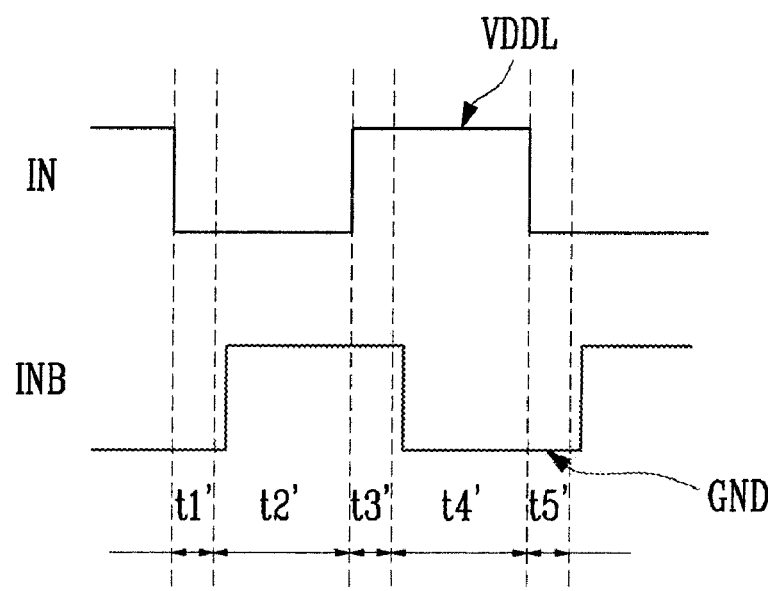
FIG. 14 is a waveform diagram showing the driving process of the level shifter shown in FIG. 13.

Hereinafter, the driving process of the level shifter shown in FIG. 13 will be described in detail in reference to FIG. 13 and FIG. 14. FIG. 14 is a waveform diagram showing the driving process of the level shifter shown in FIG. 13. For the convenience of description, it is assumed that the first and second inputs signals IN and INB have the value between 0V to 5V and the voltage values of the first, second, and third power supplies VDDH, GND, and VDDL are 10V, 0V, and 5V, respectively.

Referring to FIG. 14, first, the first input signal IN falls from 5V to 0V during a t1' period to have a value of 0V while the second input signal INB is maintained at a previous value of 0V due to a signal delay. Then, the voltage difference between the gate and source of the first transistor M1' becomes 0V corresponding to the first input signal IN so that the first transistor M1' is turned off. On the other hand, the third transistor M3' is turned on in response to the second input signal INB of 0V so that the second node N2' is charged with 5V. At this time, the fourth transistor is diode-connected so that the first node N1' is charged with (5−Vth4' (the threshold voltage of the fourth transistor M4'))V. Therefore, the second transistor M2' is turned on. As a result, the output terminal OUT and the first power supply VDDH are electrically coupled so that the output voltage Vout' becomes 10V. At this time, the first capacitor C1' is stored with (5−Vth4'−0)V that is the voltage difference between its two electrodes.

Thereafter, the first input signal IN maintains the voltage value of 0V during a t2' period and the second input signal INB rises from 0V to 5V to have the voltage value of 5V. Then, the third transistor M3' is turned off, while the voltage of the second node N2 due to the coupling action of the parasitic capacitors (not shown) existing in the third transistor M3' and the fourth transistor M4' rises to a narrow range, for example, by Vx'. However, the risen range at this time is larger than 0V and has a smaller value than the threshold voltage Vth3' of the third transistor M3'. Then, the fourth transistor M4' maintains the voltage difference between its first electrode and its second electrode to be its threshold voltage Vth4' so that the voltage value of the first node N1' rises to a narrow range, that is, by Vx'. On the other hand, the first transistor M1' maintains a turned-off state in response to the first input signal IN of 0V, and the second transistor M2' maintains a turned-on state. Therefore, the output voltage Vout' is maintained at 10V. At this time, the first capacitor C1' is charged with the voltage of (5−Vth4'+Vx'−0)V.

Thereafter, during a t3' period, the first input signal IN rises from 0V to 5V to have a voltage value of 5V and the second input signal INB maintains a voltage value of 5V. Then, the voltage value of the first capacitor C1 raises the voltage value of the first node N1' to (5−Vth4'+Vx'+5)V due to the coupling action of the first capacitor C1'. Thereby, the diode-connected fourth transistor M4' is turned off. Therefore, the voltage of the first node N1' maintains (5−Vth4'+Vx'+5)V. Then, the voltage value between the gate and source of the second transistor M2' becomes ((5−Vth4'+Vx'+5)−10)V, that is, (−Vth4'+Vx')V so that the second transistor M2' is turned off. Meanwhile, the first transistor M1' is turned on in response to the first input signal IN of 5V so that the second power supply GND and the output terminal OUT are electrically coupled to make the output voltage Vout'+0V.

Thereafter, during a t4' period, the first input signal IN maintains a voltage value of 5V and the second input signal INB falls from 5V to 0V to have a voltage value of 0V. Then, the third transistor M3' is turned on so that the second node N2' is charged with 5V again. However, even in this case, the fourth transistor M4' is supplied with the reverse voltage so that the fourth transistor M4' maintains the turned-off state. As a result, the voltage value of the first node N1' is maintained at the same value as the t3 period so that the second transistor M2' maintains the turned-off state. On the other hand, the first transistor M1' maintains the turned-on state in response to the first input signal IN of 5V so that the output voltage Vout' is maintained at +0V.

Thereafter, during a t5' period, the first input signal IN falls from 5V to 0V to have a value of 0V and the second input signal INB maintains the value of 0V. Then, the first transistor M1' is turned off, while the voltage value of the first node N1' becomes (5−Vth4'+Vx')V due to the coupling action of the first capacitor C1' to turn on the second transistor M2'. As a result, the output voltage Vout' has a voltage value of 10V.

The level shifter according to another embodiment of the present invention repeats the foregoing operations to output the output signal Vout' having the voltage range of 0V to 10V corresponding to the first and second input signals IN and INB having the voltage range of 0V to 5V. In other words, the level shifter expands the voltage range of the input signals IN and INB to output them.

With the above-mentioned level shifter according to another embodiment of the present invention, the concurrent turn on of the first transistor M1' and the second transistor M2' can be prevented so that power consumption is reduced and the delay times required for the rise and fall of the output signal Vout' can be approximately the same. Further, the delay time can be reduced.

Also, since the level shifter is not operated by the difference in the current driving ability of the first and second transistors M1' and M2', the size, i.e., the width-to-length ratio (W/L), of the transistor does not need to be large. Therefore, the area occupied by the level shifter in the driving circuit is reduced, in addition to preventing the increase in the delay time required when the voltage levels of the input signals IN and INB are changed. Also, the reliability of operation can be secured by using the diode-connected fourth transistor M4'.

Figure 15:
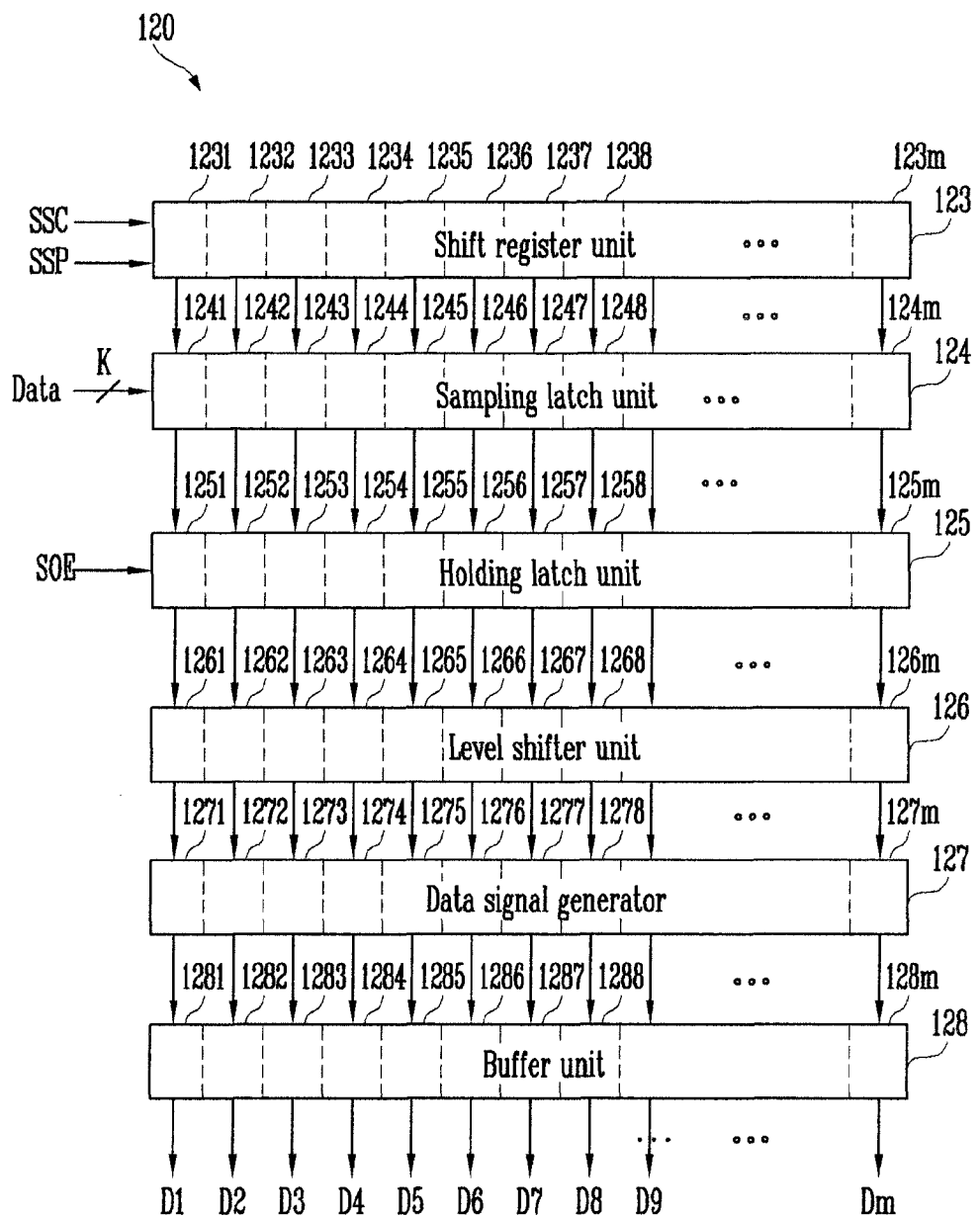
FIG. 15 is a block diagram showing one example of the data driver shown in FIG. 6.

Further, the level shifter according to an exemplary embodiment of the present invention can be adopted in the scan driver as well as the data driver, etc. FIG. 15 is a block diagram showing one example of the data driver shown in FIG. 6. In FIG. 15, it is assumed that the data driver has m channels, for the convenience of description.

Referring to FIG. 15, a data driver 120 according to an exemplary embodiment of the present invention includes: a shift register unit 123 for sequentially generating sampling signals; a sampling latch unit 124 for sequentially storing Data in response to the sampling signals; a holding latch unit 125 for temporarily storing the Data stored in the sampling latch unit 124 and for supplying the stored data to a level shifter unit 126; the level shifter unit 126 for expanding the voltage range by raising and/or lowering the voltage level of the data supplied from the holding latch unit 125; a data signal generator 127 for generating the data signals corresponding to the bit values of the Data supplied from the level shifter unit 126; and a buffer unit 128 for supplying the data signals supplied from the data signal generator 127 to the data lines D1 to Dm.

The shift register unit 123 is supplied with the source shift clock SSC and the source start pulse SSP from the timing controller 150. The shift register unit 123 supplied with the source shift clock SSC and the source start pulse SSP shifts the source start pulse SSP corresponding to the source shift clock SSC and at the same time, sequentially generates m sampling signals. To this end, the shift register unit 123 includes m shift registers 1231 to 123*m*.

The sampling latch unit 124 sequentially supplies the Data supplied thereto corresponding to the sampling signals sequentially supplied from the shift register unit 123. To this end, the sampling latch unit 124 includes m sampling latches 1241 to 124*m* for storing the m Data. Here, the sizes of the respective sampling latches 1241 to 124*m* are set to be able to store k bit Data.

The holding latch unit 125 receives and stores the Data from the sampling latch unit 124 in response to the source output enable SOE supplied from the timing controller 150 and concurrently supplies the stored Data to the level shifter unit 126. To this end, the holding latch unit 125 includes the m holding latches 1251 to 125*m*. The sizes of the respective holding latches 1251 to 125*m* are set to be able to store the k bit Data.

The level shifter unit 126 expands the voltage range of the Data by raising and/or lowering of the voltage levels of the Data supplied from the holding latch unit 125. By way of example, if an external device supplies Data having a wide range of voltage levels to the data driver 120, power consumption would be high and at the same time, a serious EMI problem might occur. Therefore, a device external to the data driver 120 uses a narrow range of low voltage to supply the Data and the data driver 120 uses the internal level shifter unit 126 to raise or lower the voltage levels of the Data, thereby expanding the voltage range of the Data. To this end, the level shifter unit 126 includes m level shifters 1261 to 126m. As one example, the level shifter unit 126 can include the level shifters shown in FIG. 10 or FIG. 13. The Data with the expanded voltage range are supplied from the level shifter unit 126 to the data signal generator 127.

The data signal generator 127 generates data signals corresponding to the bit values (or gray level values) and supplies the generated data signals to the buffer unit 128. To this end, the data signal generator 127 includes m digital-analog converters (DAC)(1271 to 127m) that are positioned at each channel.

The buffer unit 128 supplies the data signals supplied from the data signal generator 127 to the data lines D1 to Dm. The buffer unit 128 can be removed in the design process. In other words, in other embodiments, the buffer unit 128 may be not used. In such cases, the data signal generator 127 may be coupled directly to the data lines D1 to Dm.

In exemplary embodiments according to the present invention, the concurrent turn-on of the first and second transistors coupling the output terminal to the first power supply or the second power supply can be prevented. Thereby, even when the second input signal is delayed, the level shifter controls to allow only one of the first and second transistors to be turned on so that current flowing in the supply power is reduced, making it possible to reduce power consumption. Since the level shifter is not operated using the difference in the current driving ability of the first and second transistors, the size (that is, W/L) of the transistor does not need to be large. Therefore, the area occupied by the level shifter in the driving circuit is reduced, in addition to preventing the increase in the delay time required when the voltage levels of the input signals are changed.

Furthermore, the delay time of the signal generated in a path connecting the output terminal to the first power supply and the delay time of the signal generated in a path connecting the output terminal to the second power supply are designed to be similar to each other so that the difference in the delay times required for the rise and fall are reduced, in addition to reducing the delay times.

Also, the diode-connected fourth transistor is used to prevent the reverse current from being generated, making it possible to secure the reliability of operation.

Although exemplary embodiments of the present invention have been shown and described, it would be appreciated by those skilled in the art that changes might be made in these embodiments without departing from the principles and spirit of the invention, the scope of which is defined in the claims and their equivalents.

What is claimed is:

1. A level shifter comprising:
   first and second transistors serially coupled between a first power supply for supplying a first power and a second power supply for supplying a second power having a lower voltage level than that of the first power, the first and second transistors being different type transistors from each other;
   a first capacitor coupled between a gate electrode of the first transistor and a gate electrode of the second transistor;
   an input line for a first input signal coupled to the gate electrode of the first transistor or the gate electrode of the second transistor, and coupled to a first electrode of the first capacitor;
   a third transistor between a second electrode of the first capacitor and a third power supply, the third transistor having a gate electrode coupled to an input line for a second input signal, wherein the gate electrode of the first transistor and the gate electrode of the third transistor are configured to be driven by waveforms that are opposite to each other; and
   a fourth transistor between the second electrode of the first capacitor and the third transistor, the fourth transistor having a gate electrode and a first electrode that are coupled to each other and the second electrode of the first capacitor, such that the fourth transistor is diode-connected.

2. The level shifter as claimed in claim 1, wherein a transition time of the second input signal is delayed relative to the first input signal.

3. The level shifter as claimed in claim 2, wherein the second input signal is generated by inverting the first input signal.

4. The level shifter as claimed in claim 1, wherein the gate electrode of the first transistor is coupled to the input line of the first input signal and the first electrode of the first capacitor, and the gate electrode of the second transistor is coupled to the second electrode of the first capacitor.

5. The level shifter as claimed in claim 4, wherein the third and fourth transistors are same type transistors as the second transistor.

6. The level shifter as claimed in claim 5, wherein the first transistor is a P-type transistor and the second, third and fourth transistors are N-type transistors.

7. The level shifter as claimed in claim 5, wherein the first transistor is an N-type transistor and the second, third and fourth transistors are P-type transistors.

8. The level shifter as claimed in claim 1, wherein a voltage level of a third power supplied by the third power supply is between a voltage level of the first power and a voltage level of the second power.

9. A flat panel display comprising a level shifter unit comprising a plurality of level shifters, the flat panel display comprising:
   a scan driver for sequentially supplying scan signals to scan lines;
   a data driver for supplying data signals to data lines in synchronization with the scan signals; and
   a display region comprising a plurality of pixels at crossing portions between the scan lines and the data lines, and for displaying an image corresponding to the data signals, wherein
   at least one of the scan driver or the data driver comprises at least one of the plurality of level shifters comprising:
      first and second transistors serially coupled between a first power supply for supplying a first power and a second power supply for supplying a second power having a lower voltage level than that of the first power, the first and second transistors being different type transistors from each other;
      a first capacitor coupled between a gate electrode of the first transistor and a gate electrode of the second transistor;

an input line for a first input signal coupled to the gate electrode of the first transistor or the gate electrode of the second transistor, and coupled to a first electrode of the first capacitor;

a third transistor between a second electrode of the first capacitor and a third power supply, the third transistor having a gate electrode coupled to an input line for a second input signal, wherein the gate electrode of the first transistor and the gate electrode of the third transistor are configured to be driven by waveforms that are opposite to each other; and a fourth transistor between the second electrode of the first capacitor and the third transistor, the fourth transistor having a gate electrode and a first electrode that are coupled to each other and the second electrode of the first capacitor, such that the fourth transistor is diode-connected.

10. The flat panel display as claimed in claim 9, wherein the scan driver comprises:

a shift register unit for sequentially generating the scan signals corresponding to externally supplied scan driving control signals; and the level shifter unit configured to expand a voltage range of the scan signals generated by the shift register unit.

11. The flat panel display as claimed in claim 10, wherein the scan driver further comprises a buffer unit for supplying the scan signals supplied from the level shifter unit to the scan lines.

12. The flat panel display as claimed in claim 9, wherein the data driver comprises:

a shift register unit for sequentially generating sampling signals;

a sampling latch unit for sequentially storing data in response to the sampling signals;

a holding latch unit for storing the data stored in the sampling latch unit and concurrently outputting the stored data;

the level shifter unit configured to expand a voltage range of the data supplied from the holding latch unit; and a data signal generator for generating the data signals corresponding to the data supplied from the level shifter unit.

13. The flat panel display as claimed in claim 12, wherein the data driver further comprises a buffer unit for supplying the data signals to the data lines.

14. The flat panel display as claimed in claim 9, wherein a transition time of the second input signal is delayed relative to the first input signal.

15. The flat panel display as claimed in claim 14, wherein the second input signal is generated by inverting the first input signal.

16. The flat panel display as claimed in claim 9, wherein the gate electrode of the first transistor is coupled to the input line of the first input signal and the first electrode of the first capacitor, and the gate electrode of the second transistor is coupled to the second electrode of the first capacitor.

17. The flat panel display as claimed in claim 16, wherein the third and fourth transistors are same type transistors as the second transistor.

18. The flat panel display as claimed in claim 17, wherein the first transistor is a P-type transistor and the second to fourth transistors are N-type transistors.

19. The flat panel display as claimed in claim 17, wherein the first transistor is an N-type transistor and the second to fourth transistors are P-type transistors.

20. The flat panel display as claimed in claim 9, wherein a voltage level of a third power supplied by the third power supply is between a voltage level of the first power and a voltage level of the second power.

* * * * *